United States Patent
Mobley et al.

(10) Patent No.: US 12,222,375 B2
(45) Date of Patent: Feb. 11, 2025

(54) FOLDED CURRENT SENSE SHUNT RESISTOR

(71) Applicant: Schweitzer Engineering Laboratories, Inc., Pullman, WA (US)

(72) Inventors: James Mobley, Moscow, ID (US); Adam Seubert, Raleigh, NC (US); Sally M. Mei, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 177 days.

(21) Appl. No.: 18/051,155

(22) Filed: Oct. 31, 2022

(65) Prior Publication Data

US 2024/0142499 A1    May 2, 2024

(51) Int. Cl.
*G01R 19/00*   (2006.01)
*G01R 1/20*   (2006.01)

(52) U.S. Cl.
CPC ......... *G01R 19/0092* (2013.01); *G01R 1/203* (2013.01)

(58) Field of Classification Search
USPC ............................... 324/76.11, 117 R, 117 H
See application file for complete search history.

(56) References Cited

U.S. PATENT DOCUMENTS

| | | |
|---|---|---|
| 7,545,608 B2 | 6/2009 | Araki |
| 8,031,043 B2 | 10/2011 | Schultz |
| 10,388,994 B2 | 8/2019 | Tanigawa |
| 10,786,864 B2 | 9/2020 | Wakabayashi |
| 10,957,472 B2 | 3/2021 | Kobayakawa |
| 10,976,355 B2 | 4/2021 | Nakamura |
| 11,043,911 B2 | 6/2021 | Yu |
| 11,226,355 B2 | 1/2022 | Aono |
| 11,287,449 B2 | 3/2022 | Murakami |
| 11,313,885 B2 | 4/2022 | Choi |
| 11,320,490 B2 | 5/2022 | Min |

(Continued)

FOREIGN PATENT DOCUMENTS

| | | |
|---|---|---|
| WO | 2021169456 | 2/2021 |
| WO | 2021182766 | 9/2021 |

OTHER PUBLICATIONS

Hidaka, Shigeru: "Metal Plate Current Shunt Resistor, Model WSL" Technical Note, Nikkohm Co., Jun. 1, 2002.

*Primary Examiner* — Vincent Q Nguyen
(74) *Attorney, Agent, or Firm* — Fletcher Yoder, P.C.

(57) ABSTRACT

A shunt resistor may, in some cases, receive interference from magnetic fields. The shunt resistor may include a resistive element coupled between multiple conductive elements, and measurement circuitry coupled to the leads, forming an electrically conductive loop. Current through the shunt resistor may be determined by measuring the current through the resistive element at the leads. An induced voltage in the loop may be determined by the product of the loop area and the magnetic field passing through the loop. Consequently, when a magnetic field is passed through the shunt resistor loop, an undesirable interfering signal may be produced, distorting the output signal of the shunt resistor. As the interfering signal is a product of the loop area and the magnetic field, the geometry of the shunt resistor may be modified to reduce the loop area and thus reduce or minimize the interference on the shunt resistor.

20 Claims, 4 Drawing Sheets

(56) References Cited

U.S. PATENT DOCUMENTS

2014/0015636 A1\* 1/2014 Tanaka ..................... H01C 1/14
338/322
2021/0190834 A1\* 6/2021 Endo .................. G01R 19/0023
2021/0396811 A1\* 12/2021 Kawaguchi ......... H01M 50/284

\* cited by examiner

FOLDED CURRENT SENSE SHUNT RESISTOR

BACKGROUND

This disclosure relates to current measurement in an electronic device. More particularly, this disclosure relates to shunt resistors implemented to measure current in an electronic device.

Shunt resistors may be used to measure current in an electronic device. The shunt resistors may measure current through the electronic device and produce a signal proportional to current flowing through the shunt resistor. The shunt resistor may, in some cases, receive interference from magnetic fields. The interference may distort the shunt resistor's output signal, leading to undesirable impacts on the shunt resistor (e.g., reduced current measurement accuracy).

DETAILED DESCRIPTION

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be noted that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Shunt resistors may be used to measure current in an electronic device or system. The shunt resistor may measure current through the electronic device and produce a signal (e.g., a voltage) proportional to current flowing through the shunt resistor. The shunt resistor may be implemented to replace a current transformer as the shunt resistor may consume less space and less power than a current transformer and, unlike a current transformer, may also measure direct current (DC).

The shunt resistor may, in some cases, receive interference from magnetic fields. When a shunt resistor is placed inside a magnetic field, the signal (e.g., the voltage) may be distorted by interfering electromagnetic signals (e.g., causing an induced voltage) induced by the magnetic fields. The interfering signals may be associated with a nearby power signal (e.g., a 50 hertz (Hz) power signal, a 60 Hz power signal, and so on) emitted from nearby electrical conductors, radio transmitters, electronic devices, naturally occurring electromagnetic compatibility events (e.g., an electrostatic discharge, such as a lightning strike), and so on.

The shunt resistor may include a resistive element coupled between multiple conductive elements. The conductive elements may each include conductive plates, the conductive plates include conductive leads (e.g., Kelvin leads) protruding beyond the resistive element. A high current signal may be passed to a first conductive plate, through the resistive element and out through a second conductive plate. The resistive element may convert the high current signal to a proportional low voltage signal. Measurement circuitry may be coupled to the shunt resistor via the leads, forming an electrically conductive loop. Current through the shunt resistor may be determined (e.g., via the measurement circuitry) based on the current through the resistive element at the leads and/or the voltage signal outputted by the resistive element. An induced voltage in the loop may be determined by the product of the loop area and the magnetic field passing through the loop. Consequently, when a magnetic field is passed through the shunt resistor loop, an undesirable interfering signal may be produced, distorting the output signal of the shunt resistor.

As the interfering signal (e.g., an induced voltage on the shunt resistor, particularly the resistive element of the shunt resistor) is a product of the loop area and the magnetic field passing through the loop, the geometry of the shunt resistor may be modified to reduce the loop area and thus reduce or minimize the interference on the shunt resistor. In some embodiments, the loop area may be reduced or minimized by affixing an insulative material to a portion of the shunt resistor (e.g., affixing the insulative material to a conductive plate, conductive leads, and/or a resistive element of the shunt resistor). A conductive material may then be overlaid on top of the insulative material. In some embodiments, the insulative and conductive materials may be affixed by a metal clip.

In other embodiments, the loop area may be reduced or minimized by folding the shunt resistor and/or the resistive element coupled to the shunt resistor such that the two conductive plates are disposed parallel to each other. The conductive plates may be separated by an insulative materials (e.g., air, a plastic compound, and so on). In some instances, it may be beneficial to reduce or minimize the space between the conductive plates to reduce or minimize the area of the loop. In some embodiments, the resistive element of the shunt resistor may be folded or manufactured into particular geometries that may further reduce the loop area.

Figure 1:
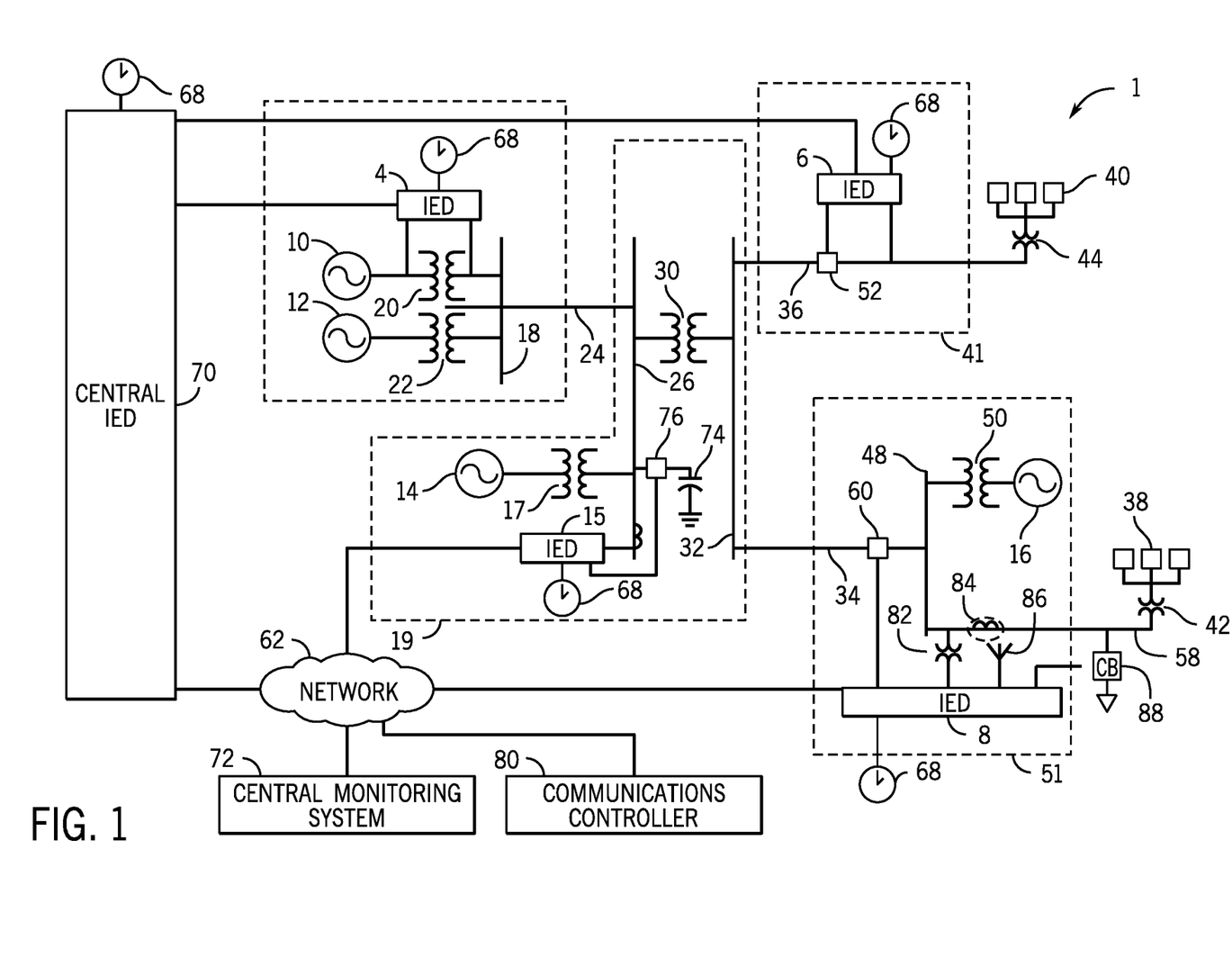
FIG. 1 is a schematic diagram of an electric power delivery system, in accordance with an embodiment.

FIG. 1 illustrates a simplified diagram of an electric power delivery system 1, in accordance with an embodiment of the present disclosure. The electric power delivery system 100 may generate, transmit, and/or distribute electric energy to one or more loads. As illustrated, the electric power delivery system 1 includes electric generators 10, 12, 14, and 16. The electric power delivery system 1 may also include power transformers 17, 20, 22, 30, 42, 44, and 50. Furthermore, the electric power delivery system may include lines 24, 34, 36, and 58 to transmit and/or deliver power. Circuit breakers 52, 60, and 76 may be used control flow of power in the electric power delivery system 1. Busses 18, 26, 32, and 48 and/or loads 38 and 40 receive the power in and/or from (e.g., output by) the electric power delivery system 1. A variety of other types of equipment may also be included in electric power delivery system 1, such as current sensors (e.g., wireless current sensor (WCS) 84), potential transformers (e.g., potential transformer 82), voltage regulators, capacitors (e.g., capacitor 74) and/or capacitor banks (e.g., capacitor bank (CB) 88), antennas (e.g., antenna 86), and other suitable types of equipment useful in power generation, transmission, and/or distribution.

A substation 19 may include the electric generator 14, which may be a distributed generator, and which may be connected to the bus 26 through the power transformer 17 (e.g., a step-up transformer). The bus 26 may be connected to a distribution bus 32 via the power transformer 30 (e.g., a step-down transformer). Various distribution lines 36 and 34 may be connected to the distribution bus 32. The distribution line 36 may be connected to a substation 41 where the distribution line 36 is monitored and/or controlled using an intelligent electronic device (IED) 06, which may selectively open and close the circuit breaker 52. A load 40 may be fed from distribution line 36. The power transformer 44 (e.g., a step-down transformer), in communication with the distribution bus 32 via distribution line 36, may be used to step down a voltage for consumption by the load 40.

A distribution line 34 may deliver electric power to a bus 48 of the substation 51. The bus 48 may also receive electric power from a distributed generator 16 via transformer 50. The distribution line 58 may deliver electric power from the bus 48 to a load 38, and may include the power transformer 42 (e.g., a step-down transformer). A circuit breaker 60 may be used to selectively connect the bus 48 to the distribution line 34. The IED 8 may be used to monitor and/or control the circuit breaker 60 as well as the distribution line 58.

The electric power delivery system 1 may be monitored, controlled, automated, and/or protected using IEDs such as the IEDs 4, 6, 8, 15, and 70, and a central monitoring system 72. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 4, 6, 8, 15, and 70) may refer to any processing-based device that monitors, controls, automates, and/or protects monitored equipment within the electric power delivery system 1. Such devices may include, for example, remote terminal units, merging units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular). In some cases, the IEDs may be located remote from the respective substation and provide data to the respective substation via a fiber-optic cable.

A common time signal may be distributed throughout the electric power delivery system 1. Utilizing a common time source 68 may ensure that IEDs have a synchronized time signal that can be used to generate time synchronized data, such as synchrophasors. In various embodiments, the IEDs 4, 6, 8, 15, and 70 may be coupled to a common time source(s) 68 and receive a common time signal. The common time signal may be distributed in the electric power delivery system 1 using a communications network 62 and/or using a common time source 68, such as a Global Navigation Satellite System ("GNSS"), or the like.

According to various embodiments, the central monitoring system 72 may include one or more of a variety of types of systems. For example, the central monitoring system 72 may include a supervisory control and data acquisition (SCADA) system and/or a wide area control and situational awareness (WACSA) system. Additionally or alternatively, the central monitoring system 72 may include an intrusion detection system that may receive data (e.g., notifications, data packets, messages, and the like) from any of the IEDs 4, 6, 8, 15 and central IED 70 and may process and/or troubleshoot the received data to determine a cause of a cybersecurity event or network abnormality. A central IED 70 may be in communication with the IEDs 4, 6, 8, and 15. The IEDs 4, 6, 8 and 15 may be located remote from the central IED 70, and may communicate over various media such as a direct communication from IED 6 or over the communications network 62. According to various embodiments, some IEDs may be in direct communication with other IEDs. For example, the IED 4 may be in direct communication with the central IED 70. Additionally or alternatively, some IEDs may be in communication via the communications network 62. For example, the IED 8 may be in communication with the central IED 70 via the communications network 62. In some embodiments, an IED may refer to a relay, a merging unit, or the like.

Communication via the communications network 62 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power delivery system 1.

A communications controller 80 may interface with equipment in the communications network 62 to create a software-defined network (SDN) that facilitates communication between the IEDs 4, 6, 8, 15, and 70 and the central monitoring system 72. In various embodiments, the communications controller 80 may interface with a control plane (not shown) in the communications network 62. Using the control plane, the communications controller 80 may direct the flow of data within the communications network 62.

The communications controller 80 may receive information from multiple devices in the communications network 62 regarding transmission of data. In embodiments in which the communications network 62 includes fiber optic communication links, the data collected by the communications controller 80 may include reflection characteristics, attenuation characteristics, signal-to-noise ratio characteristics, harmonic characteristics, packet loss statics, and the like. In embodiments in which the communications network 62 includes electrical communication links, the data collected by the communications controller 80 may include voltage measurements, signal-to-noise ratio characteristics, packet loss statics, and the like. In some embodiments, the communications network 62 may include both electrical and optical transmission media. The information collected by the communications controller 80 may be used to assess a likelihood of a failure, to generate information about precursors to a failure, and to identify a root cause of a failure. The communications controller 80 may associate information regarding a status of various communication devices and communication links to assess a likelihood of a failure. Such associations may be utilized to generate information about the precursors to a failure and/or to identify root cause(s) of a failure consistent with embodiments of the present disclosure.

Embodiments presented herein may monitor communications of one or more of the IEDs 4, 6, 8, 15, 70 and, in particular, monitor data packets received at and/or transmitted from one or more of the IEDs 4, 6, 8, 15, 70. Such monitoring may determine an occurrence of a security event, communications stresses, and/or the like.

Figure 2:
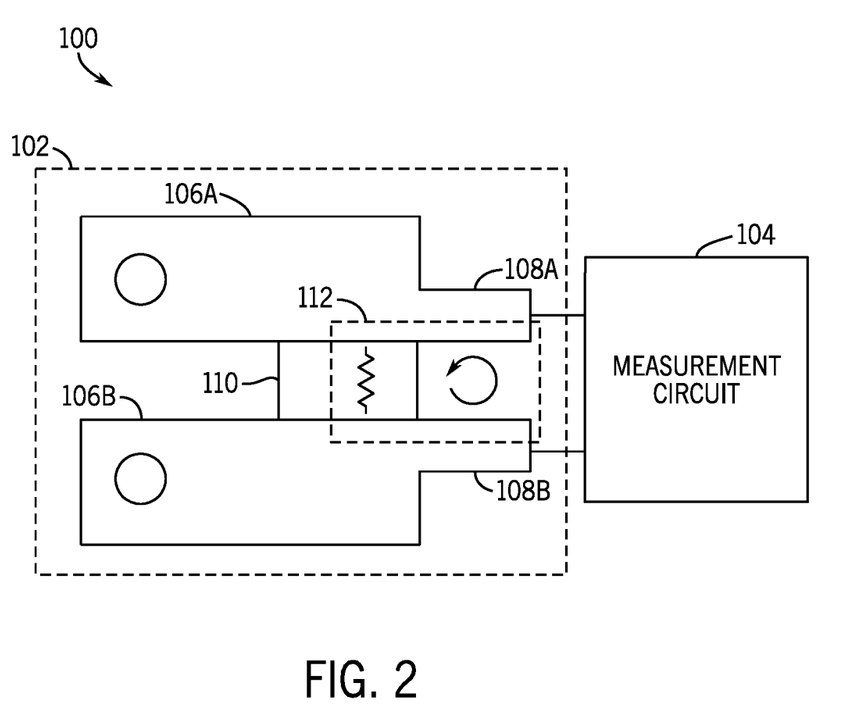
FIG. 2 is a schematic diagram of a current measuring device, including a shunt resistor coupled to a measurement circuit.

With the foregoing in mind, FIG. 2 is a schematic diagram of a current measuring device 100, including a shunt resistor 102 coupled to a measurement circuit 104. The shunt resistor may include two conductive plates 106A and 106B and a resistive element 110 coupled between the conductive plates 106A and 106B. Each conductive plate 106A and 106B includes a lead 108A and 108B (e.g., Kelvin leads) to which the measurement circuit 104 is coupled. A loop 112 is formed by the conductive plates 106A and 106B (e.g., in particular, the leads 108A and 108B), and the resistive element 110. In some embodiments, the conductive plates 106A and 106B and the leads 108A and 108B may include one or more conductive materials (e.g., copper) and the resistive element 110 may include one or more resistive materials (e.g., an alloy including copper, manganese, and nickel).

The shunt resistor 102 may receive an electrical current from an electronic device, such as the LEDs 4, 6, 8, 15, and 70, convert (e.g., via the resistive element 110) the current to a proportional voltage signal, and the measurement circuit 104 may determine the current supplied to the shunt resistor 102 based on the voltage signal. As mentioned above, a magnetic field may cause interference (e.g., an induced voltage) in the loop 112. Consequently, the current measured by the measurement circuitry 104 may be less accurate due to the induced voltage. As the induced voltage is a product of the area of the loop 112 and the magnetic field passing through the loop 112, the geometry of the shunt resistor 102 may be modified to reduce the area of the loop 112 and thus reduce or minimize the interference on the shunt resistor 102.

Figure 3:
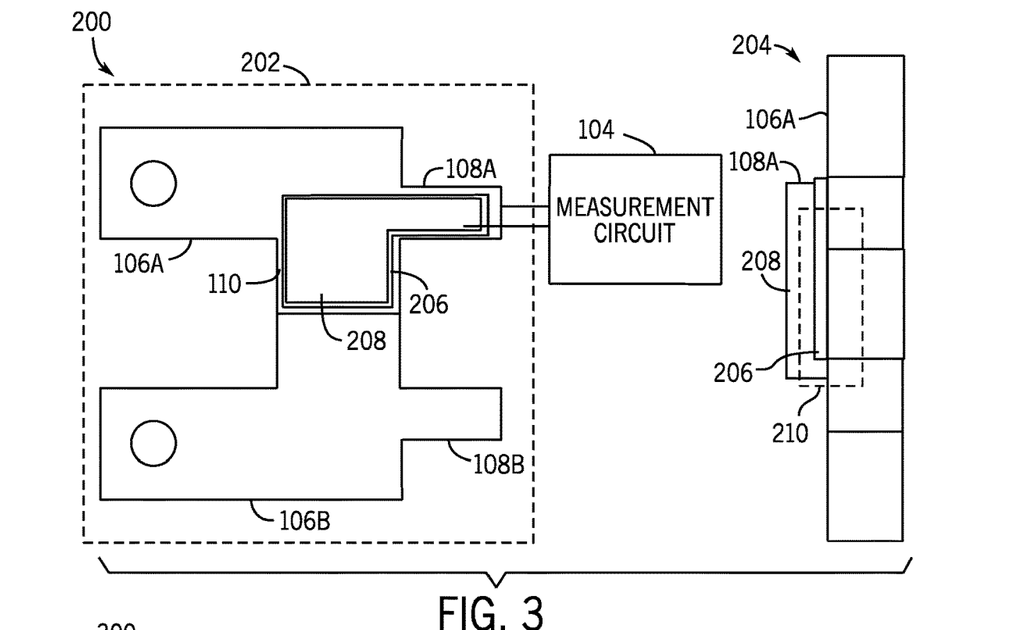
FIG. 3 includes a schematic diagram illustrating a top perspective of a shunt resistor with a modified geometry and a schematic diagram illustrating a side perspective of the shunt resistor with the modified geometry, in accordance with an aspect of the present disclosure.

FIG. 3 includes a schematic diagram 200 illustrating a top perspective of a shunt resistor 202 with a modified geometry and a schematic diagram 204 illustrating a side perspective of the shunt resistor 202 with the modified geometry, in accordance with an aspect of the present disclosure. The shunt resistor 202 may include the conductive plate 106A, the lead 108A, and the resistive element 110. The shunt resistor 202 includes an insulator 206 (e.g., a thin sheet of insulative material, such as a plastic compound) coupled to the conductive plate 106A, the lead 108A, and the resistive element 110. The shunt resistor 202 includes a conductor 208 (e.g., a thin sheet of conductive material, such as copper) electrically coupled to the insulator 206 and the conductive plate 106B. The insulator 206 and the conductor 208 may be affixed to the shunt resistor 202 via a conductive clip. As may be observed from the schematic diagram 204 of the shunt resistor 202, an electrically conductive loop (e.g., a loop 210) is formed by the conductive plate 106A, the lead 108A, the resistive element 110 and the conductor 208. The area of the loop 210 may be less than the area of the loop 112 discussed with respect to FIG. 2. As discussed, the smaller area of the loop 210 may result in reduced interference (e.g., a smaller induced voltage) on the shunt resistor 202 due to a magnetic field. It may be observed that the shunt resistor 110 may be smaller, and thus may consume less area on a printed circuit board (PCB), due to the loop 210 being formed by conductive plate 106A, the resistive element 110, and the conductor 208.

Figure 4:
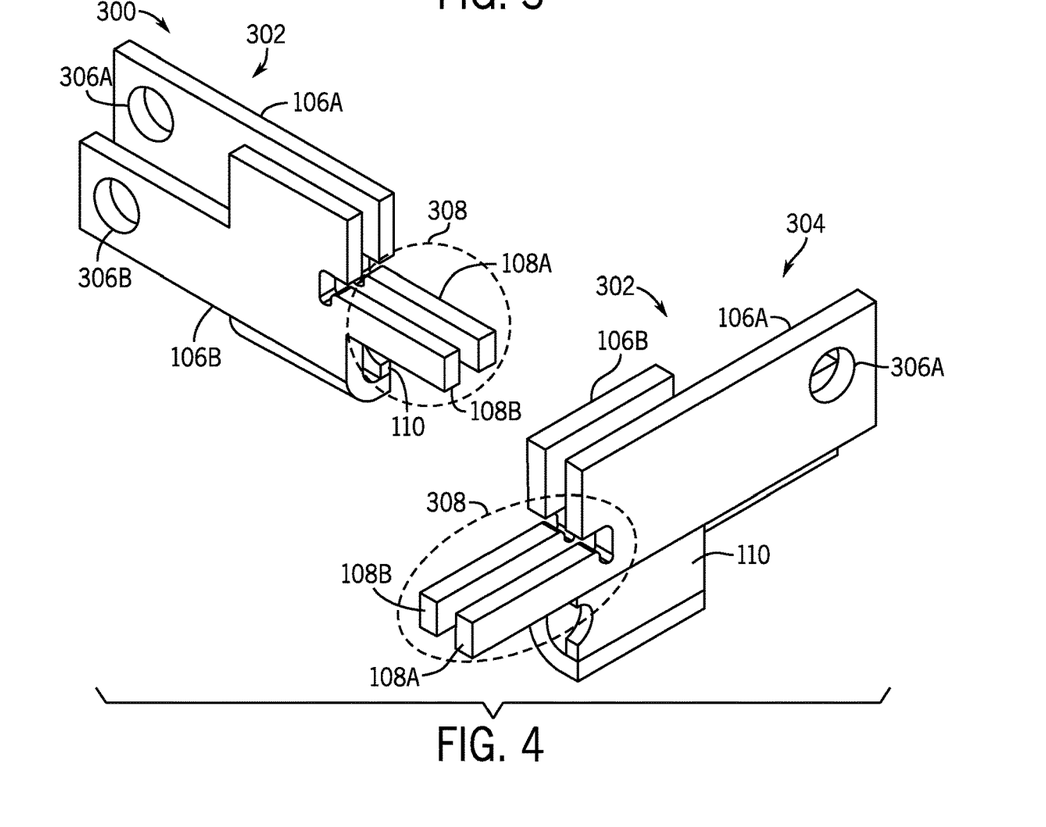
FIG. 4 includes a first perspective view of a folded shunt resistor and a second perspective view of the folded shunt resistor, in accordance with an aspect of the present disclosure.

In some embodiments, an electrically conductive loop may be formed by folding a shunt resistor (e.g., 102) about an axis such that an edge surface of each of the conductive plates are positioned parallel to each other, with one conductive plate (e.g., 106A) is disposed a distance from another conductive plate (e.g., 106B). FIG. 4 includes a first perspective view 300 of a folded shunt resistor 302 and a second perspective view 304 of the folded shunt resistor 302, in accordance with an aspect of the present disclosure. The folded shunt resistor 302 includes the conductive plates 106A and 106B, the conductive plates 106A and 106B including the conductive leads 108A and 108B, respectively. In some embodiments, the conductive plates 106A and 106B may be manufactured to include asymmetric geometries. For example, at least a portion of the conductive plate 106A may extend outward about an axis a greater distance than the at least a portion of the conductive plate 106B. While not shown in FIG. 4, the measurement circuitry 104 may be coupled to the conductive leads 108A and 108B to determine the current through the shunt resistor 302 (e.g., based on the voltage of the resistive element 110) as illustrated and discussed with respect to FIG. 2 and FIG. 3.

The conductive plates 106A and 106B may be separated by an insulative material (e.g., air, a plastic compound, and so on). In some instances, it may be beneficial to minimize the space between the conductive plate 106A and the conductive plate 106B to minimize the area of an electrically conductive loop (e.g., loop 308). The conductive plates 106A and 106B each include a ring terminal 306A and 306B, respectively. In some embodiments the ring terminals 306A and 306B may be symmetrically aligned. In other embodiments, the ring terminals 306A and 306B may be offset from each other (e.g., such that the ring terminal 306A is set below the ring terminal 306B). This may be accomplished by asymmetrically folding the shunt resistor 302, drilling the ring terminals 306A and 306B at offset heights on their respective conductive plates, and so on.

The shunt resistor 302 includes the resistive element 110. As may be observed with respect to the second perspective view 304, the resistive element may be coupled to the conductive plates 106A and 106B. The resistive element 110 may be disposed beneath the conductive plates 106A and 106B. In some embodiments, the resistive element 110 may be enclosed on at least three sides by the conductive plates 106A and 106B. In other embodiments, the geometry of the resistive element 110 may be adjusted by folding the resistive element 110, changing the size or shape of the resistive element 110, and so on.

Figure 5:
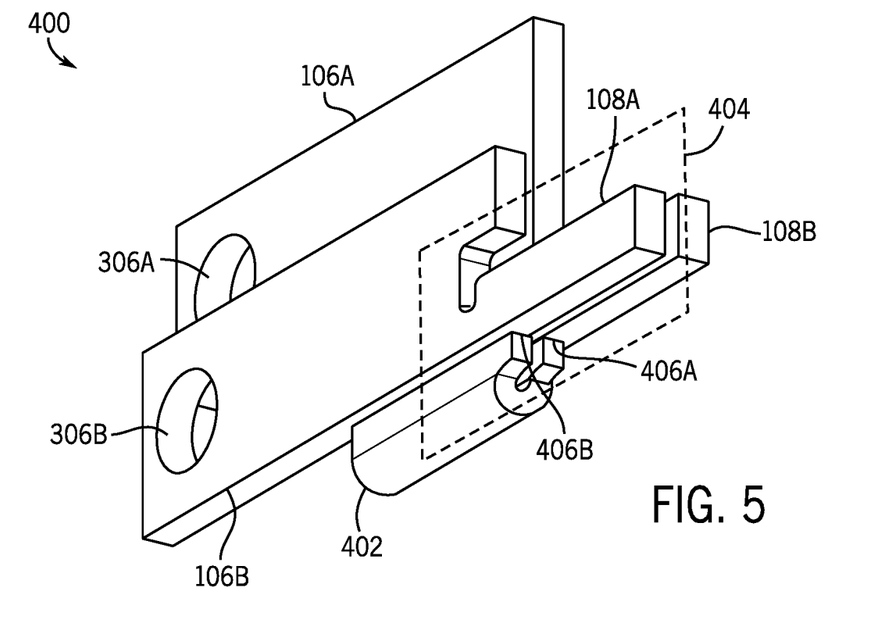
FIG. 5 is a perspective view of a folded shunt resistor including a folded resistive element, in accordance with an aspect of the present disclosure.

FIG. 5 is a folded shunt resistor 400 including a folded resistive element 402, in accordance with an aspect of the present disclosure. Similar to the first perspective view 300 and the second perspective view 304 of the shunt resistor 302 discussed above, the shunt resistor 400 includes the conductive plates 106A and 106B, the conductive plates 106A and 106B including the leads 108A and 108B, respectively and including the ring terminals 306A and 306B, respectively. As discussed above, the conductive plates 106A and 106B may be separated by an insulative materials (e.g., air, a plastic compound, and so on). In some instances, it may be beneficial to minimize the space between the conductive plate 106A and the conductive plate 106B to minimize the area of an electrically conductive loop (e.g., loop 404).

As discussed above, the ring terminals 306A and 306B may be symmetrically aligned or may be offset from each other (e.g., such that the ring terminal 306B is set below the ring terminal 306A, or vice versa). While not shown in FIG. 5, the measurement circuitry 104 may be coupled to the conductive leads 108A and 108B to determine the current through the shunt resistor 400 (e.g., based on the voltage of the resistive element 402) as illustrated and discussed with respect to FIG. 2 and FIG. 3.

The folded resistive element 402 may be folded into a semicylindrical shape, such that a first edge surface 406A and a second edge surface 406B of the folded resistive element 402 are positioned parallel to each other and symmetrically about an axis. The first edge surface 406A is coupled to the conductive plate 106A such that the first edge surface 406A and the conductive plate 106A are positioned in parallel. The second edge surface 406B is coupled to the conductive plate 106B such that the second edge surface 406B and the conductive plate 106B are positioned in parallel. By folding the folded resistive element 402, the area of the loop 404 may be reduced to less than loops associated with other configurations (e.g., the loop 112). Consequently, the folded shunt resistor 400 and folded resistive element 402 may reduce the induced voltage on the folded shunt resistor 400 while preserving the current measuring characteristics of the folded shunt resistor 400 (e.g., by preserving the current measuring characteristics of the leads 108A and 108B).

Figure 6:
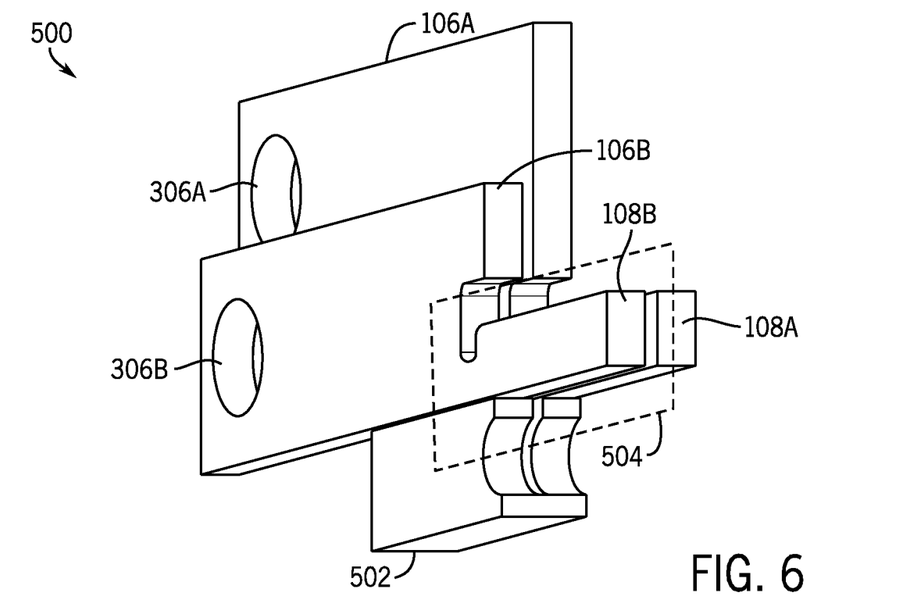
FIG. 6 is a shunt resistor including a resistive element, where the resistive element is a variation of the folded resistive element of FIG. 5, in accordance with an aspect of the present disclosure.

FIG. 6 is a shunt resistor 500 including a resistive element 502, wherein the resistive element 502 is a variation of the folded resistive element 402 discussed with respect to FIG. 5, in accordance with an aspect of the present disclosure. The resistive element 502 may be manufactured into a rectangular block. For example, the resistive element 502 may be formed by combining (e.g., welding) two resistive sub-elements of a given thickness into a single structure. The resistive element 502 may be coupled or affixed to the conductive plates 106A and 106B to form the loop 504. The resistive element 502 may preserve the resistive characteristics of the folded resistive element 402 and preserve the connection of the conductive plates 106A and 106B to the resistive element 502 while maintaining an electrically conductive loop with a relatively small area (e.g., the loop 504).

It should be noted that the embodiments discussed above may be implemented alongside with or in conjunction with a variety of methods to reduce interference on a shunt resistor due to a magnetic field. For example, any of the embodiments discussed above may be enclosed within a chassis (e.g., a steel chassis) designed to shield the shunt resistor, the measurement circuitry, and so on from the magnetic field. Additionally, any of the embodiments discussed above may include an electrical connector geometry that enables any of the shunt resistors discussed above to be able to electrically couple to connectors designed to couple to a current transformer.

While specific embodiments and applications of the disclosure have been illustrated and described, it is to be noted that the disclosure is not limited to the precise configurations and devices disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be noted that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A shunt resistor, comprising:
  a conductive plate, the conductive plate comprising a conductive lead, the conductive lead coupled to measurement circuitry;
  a resistive element coupled to the conductive plate, the resistive element:
    comprises a single resistive element folded to form an at least partially semicylindrical shape, wherein a first edge surface of the resistive element runs parallel to and facing a second edge surface of the resistive element; and is configured to receive an electrical current and convert the electrical current to a voltage;

an insulator coupled to the conductive plate, the conductive lead, the resistive element, or any combination thereof, and a conductor coupled to the insulator, such that an electrically conductive loop is formed between the conductive plate, the resistive element, and the conductor.

2. The shunt resistor of claim 1, wherein the insulator, the conductor, or both, are coupled to the conductive plate via a conductive clip.

3. The shunt resistor of claim 1, wherein the measurement circuitry is configured to determine the voltage associated with the resistive element and, based on the voltage, determine a current through the leads.

4. A current measuring device, comprising:
a shunt resistor, comprising:
  a first conductive plate comprising a first conductive lead;
  a second conductive plate comprising a second conductive lead;
  a resistive element coupled to the first conductive plate and the second conductive plate, the resistive element folded such that a first edge surface of the resistive element is positioned parallel to and facing a second edge surface of the resistive element; and
  an insulator disposed between the first conductive plate and the second conductive plate; and
measurement circuitry coupled to the first conductive lead and the second conductive lead, the measurement circuitry configured to determine an electrical current through the shunt resistor based on a voltage difference between the first conductive lead and the second conductive lead.

5. The current measuring device of claim 4, wherein the first conductive plate and the second conductive plate comprise a first copper plate and a second copper plate.

6. The current measuring device of claim 4, wherein the first conductive plate comprises a first ring terminal and the second conductive plate comprises a second ring terminal, the first ring terminal and the second ring terminal configured to effectuate an electrical connection.

7. The current measuring device of claim 6, wherein first ring terminal and the second ring terminal are positionally offset.

8. The current measuring device of claim 4, wherein the first conductive plate and the second conductive plate are folded asymmetrically about an axis.

9. The current measuring device of claim 4, wherein the shunt resistor is configured to receive the electrical current through the first conductive plate and the second conductive plate and convert the current to a voltage.

10. The current measuring device of claim 9, wherein the voltage comprises a voltage value that is proportional to a current value associated with the electrical current.

11. The current measuring device of claim 9, wherein the measurement circuitry is configured to determine the electrical current through the shunt resistor based on the voltage.

12. A current measuring device, comprising:
a shunt resistor, comprising:
  a first conductive plate comprising a first conductive lead;
  a second conductive plate disposed parallel to the first conductive plate comprising a second conductive lead;
  an insulator disposed between the first conductive plate and the second conductive plate; and
  a resistive element coupled to the first conductive plate and the second conductive plate, wherein the resistive element
    comprises a single resistive element folded to form an at least partially semicylindrical shape such that a first edge surface of the resistive element runs parallel to and facing a second edge surface of the resistive element; and
measurement circuitry coupled to the first conductive lead and the second conductive lead, the measurement circuitry configured to determine an electrical current through the shunt resistor based on a voltage difference between the first conductive lead and the second conductive lead.

13. The current measuring device of claim 12, wherein the resistive element, the first conductive plate, and the second conductive plate are configured to reduce an area of an electrically conductive loop.

14. The current measuring device of claim 13, wherein reducing the area of the electrically conductive loop reduces an induced voltage on the shunt resistor due to a magnetic field.

15. The current measuring device of claim 12, comprising a chassis enclosing the shunt resistor, wherein the chassis is configured to reduce an induced voltage on the shunt resistor due to a magnetic field.

16. The current measuring device of claim 12, wherein the resistive element comprises an alloy comprising copper, manganese, nickel, or any combination thereof.

17. The current measuring device of claim 12, wherein the insulator comprises air.

18. The current measuring device of claim 12, wherein the first conductive plate extends along a first plane in a first direction of a first conductive lead and the second conductive plate extends along a second plane in a second direction of a second conductive lead.

19. The current measuring device of claim 18, wherein the first plane is different from the second plane.

20. The current measuring device of claim 19, wherein the first plane extends parallel to the second plane.

* * * * *